United States Patent
Yankilevich et al.

(10) Patent No.: US 10,261,858 B2
(45) Date of Patent: Apr. 16, 2019

(54) TCAM SOFT-ERROR DETECTION METHOD AND APPARATUS

(71) Applicant: Intel Corporation, Santa Clara, CA (US)

(72) Inventors: Yevgeny Yankilevich, Tirat Carmel (IL); Gal Malchi, Hasolelim (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/390,465

(22) Filed: Dec. 24, 2016

(65) Prior Publication Data

US 2017/0206129 A1 Jul. 20, 2017

Related U.S. Application Data

(60) Provisional application No. 62/280,851, filed on Jan. 20, 2016.

(51) Int. Cl.
*G06F 11/10* (2006.01)
*G11C 29/10* (2006.01)

(52) U.S. Cl.
CPC .......... *G06F 11/1064* (2013.01); *G11C 29/10* (2013.01)

(58) Field of Classification Search
CPC .... G06F 11/1064; G06F 11/106; G06F 3/064; G06F 3/0604; G06F 3/0673; G06F 11/1072

See application file for complete search history.

(56) References Cited

U.S. PATENT DOCUMENTS

| | | | |
|---|---|---|---|
| 2012/0144244 A1* | 6/2012 | Dan | G11C 29/10 714/39 |
| 2015/0106677 A1* | 4/2015 | Greenfield | G06F 11/1064 714/767 |

FOREIGN PATENT DOCUMENTS

WO WO-2015167559 A1 * 11/2015 .......... G06F 17/3033

OTHER PUBLICATIONS

Marco Ottavi et al., Error detection in Ternary CAMs using bloom filters, 2013, IEEE, pp. 1 to 6.*
Kuang et al., Soft errors in FPGA implemented asynchronous circuits, 2011, IEEE, pp. 221-226.*
Baet et al., Minimizing soft errors in TCAM devices: a probabilistic approach to determining scrubbing intervals, Apr. 2010, IEEE Trans on Circuits and Sys. vol. 57, No. 4, pp. 814 to 822.*
Abbas et al., An efficient multiple cell upsets tolerant content addressable memory, 2013, IEEE, pp. 2094-2098.*

* cited by examiner

*Primary Examiner* — Shelly A Chase
(74) *Attorney, Agent, or Firm* — Schwabe, Williamson & Wyatt, P.C.

(57) ABSTRACT

Apparatuses, methods and storage medium associated with techniques to detect soft errors of a TCAM are disclosed herein. In embodiments, an apparatus may include a TCAM, and logic and/or circuitry to apply a plurality of fault detection patterns to the TCAM to generate respective hit output arrays for the plurality of fault detection patterns, generate parity signatures for the hit output arrays, and compare the generated parity signatures to expected parity values. Other embodiments may be disclosed or claimed.

22 Claims, 9 Drawing Sheets

| Description | Entry0 (state) | Entry1 (state) | Mask (input) | Key (input) | Hit (output) |
|---|---|---|---|---|---|
| Global don't care | X | X | 0 | X | 1 |
| Invalid | 0 | 0 | 1 | X | 0 |
| Must be 0, is 0 | 1 | 0 | 1 | 0 | 1 |
| Must be 0, is 1 | 1 | 0 | 1 | 1 | 0 |
| Must be 1, is 0 | 0 | 1 | 1 | 0 | 0 |
| Must be 1, is 1 | 0 | 1 | 1 | 1 | 1 |
| Local don't care | 1 | 1 | 1 | X | 1 |

| Read Line E0 | Read Line E1 | Write Line E0/E1 | "1 Value Pattern" Changed | "0 Value Pattern" Changed |
|---|---|---|---|---|
| 0 | 0 | 0 | 0 | 0 |
| 0 | 0 | 1 | {0}/{1} | {1}/{0} |
| 0 | 1 | 0 | {0}/{1} | 0 |
| 0 | 1 | 1 | 0 | {1}/{0} |
| 1 | 0 | 0 | 0 | {1}/{0} |
| 1 | 0 | 1 | {0}/{1} | 0 |
| 1 | 1 | 0 | {0}/{1} | {1}/{0} |
| 1 | 1 | 1 | 0 | 0 |

Figure 6

TCAM SOFT-ERROR DETECTION METHOD AND APPARATUS

RELATED APPLICATION

This application is a non-provisional application of provisional application 62/280,851, entitled "TCAM Soft-Error Detection Method and Apparatus," filed on Jan. 20, 2016, and claims priority to the 62/280,851 provisional application. The Specification of provisional application 62/280,851 is hereby fully incorporated by reference.

TECHNICAL FIELD

The present disclosure relates to the fields of computing and memory. In particular, the present disclosure is related to methods and apparatuses for detecting soft errors of Ternary-Content-Addressable-Memory (TCAM).

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

It is generally understood that being large and high density arrays, TCAMs can be largely affected by soft-errors. Common approaches of detecting and correcting these errors include a mechanism (hardware or software) which repeatedly reads the TCAM rules and compare them to corresponding error correction codes (ECC) stored in another memory. In general, the Reads are highly time consuming operations in TCAMs, and amount of TCAM entries can be very large. Therefore, the common process of checking the entire TCAM for soft-errors can take mass amount of time. In addition, overall failure-in-time (FIT) rate in TCAM is directly proportional to the time between the upset and its subsequent correction by the mechanism (in worst case, time needed to scan the entire array). Thus, a more efficient mechanism of checking a TCAM for soft-errors may be very helpful.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 4 illustrates an example Truth Table for encoding the TCAM, according to some embodiments.

FIG. 6 illustrates an example Truth Table for implementing the "0 Value Pattern" changed" and "1 Value Pattern" changed" in FIG. 5, according to some embodiments.

DETAILED DESCRIPTION

Figure 1:
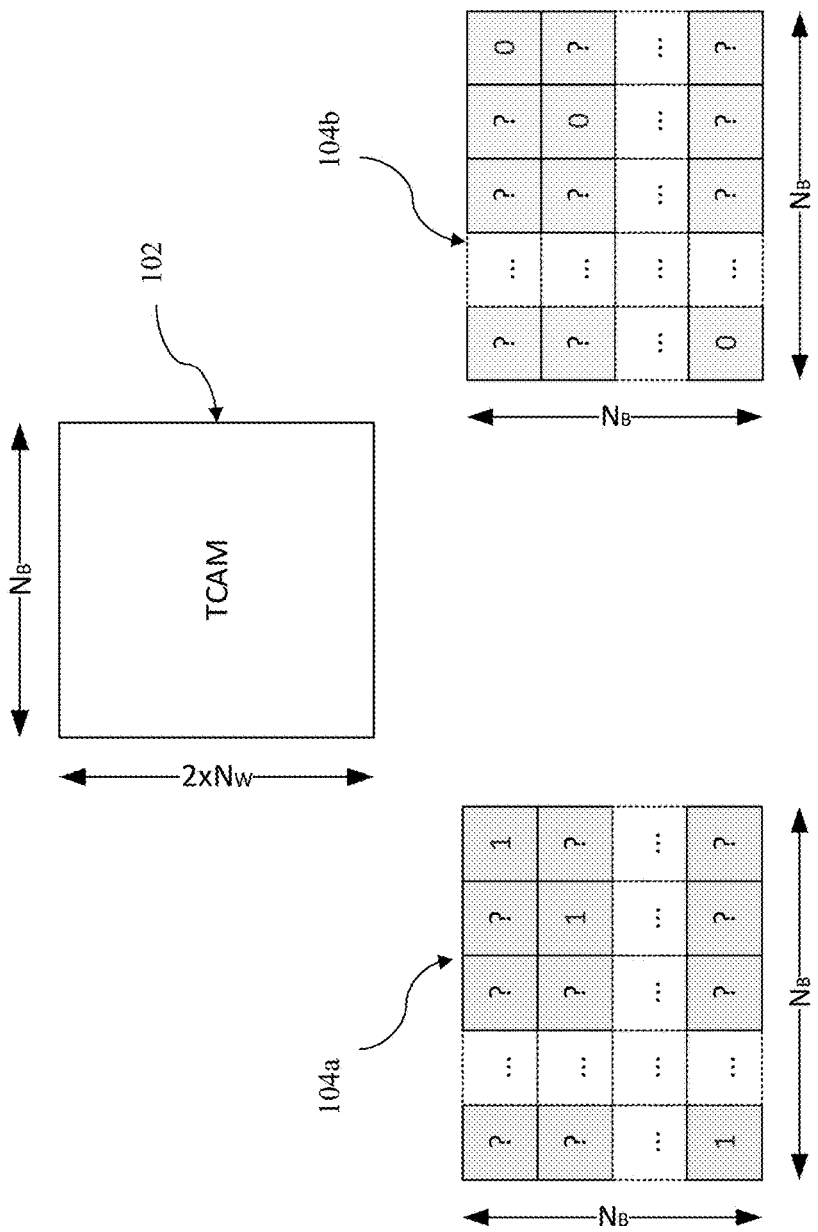
FIG. 1 illustrates an overview of an example TCAM array and a couple of fault detection patterns, in accordance with various embodiments.

Disclosed herein are method, apparatus and storage medium associated with checking an entire TCAM array having key and mask inputs as part of the search mechanism, in a substantially constant amount of time, independent of the height of the array (number of rules). The technology may include a set of fault detection patterns which may be compared against all entries in TCAM (regular lookup operation) one by one, to generate a hit output pattern or array. The produced hit output pattern or array may then be used to generate a parity signature and checked against an expected parity for that pattern. If these two do not match, it may mean that upset occurred, and the TCAM may be reconfigured to fix the error.

The technology makes the duration of checking the entire TCAM for soft-errors dependent only on the width of the TCAM (bits per rule), which in general is substantially smaller than the height by about 3 or more orders of magnitude. Additionally, in contrast to prior art mechanisms, which rely on TCAM read operations, the disclosed technology is based on compare operations, which may be much more 'economical' in clock cycles per operation. Further, the disclosed technology may be capable of detecting any amount (all) of errors in a single rule, while the prior art solutions are limited by ECC strength. Still further, the disclosed technology can be extended to detect any amount of Multi-Bit Upset (MBU) events which affect joint lines of the array. These and other aspects of the technology are described further below.

In the description to follow, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the term "module" may refer to, be part of, or include an Application Specific Integrated Circuit (ASIC), an electronic circuit, a programmable circuit (e.g., Field Programmable Gate Array (FPGA)), a processor (shared, dedicated, or group) and/or memory (shared, dedicated, or group) that execute one or more software or firmware programs with instructions that implement the logic, a combinational logic circuit, and/or other suitable components that provide the described functionality.

Referring now to FIG. 1, wherein an example TCAM array and a couple of fault detection patterns, according to some embodiments, are shown. Illustrated is a $N_W$—rule TCAM 102 which appears as a $2 \times N_W$—entry array; each entry in this array is of $N_B$ bits wide. The fault detection patterns for checking soft errors of TCAM 102 may be comprised of two sets of $N_B \times N_B$ patterns as illustrated. The two groups of patterns, may be example "1 Value Patterns" 104a and example "0 Value Patterns 104b shown in FIG. 1. In alternate embodiments, other Value Patterns may be employed instead. In embodiments, TCAM 102 may comprise cells that are formed with a plurality of transistors (e.g., 10-12 transistors) to store a single bit. In other embodiments, TCAM 102 may comprise cells that are emulated with static random access memory (SRAM) cells.

Figure 2:
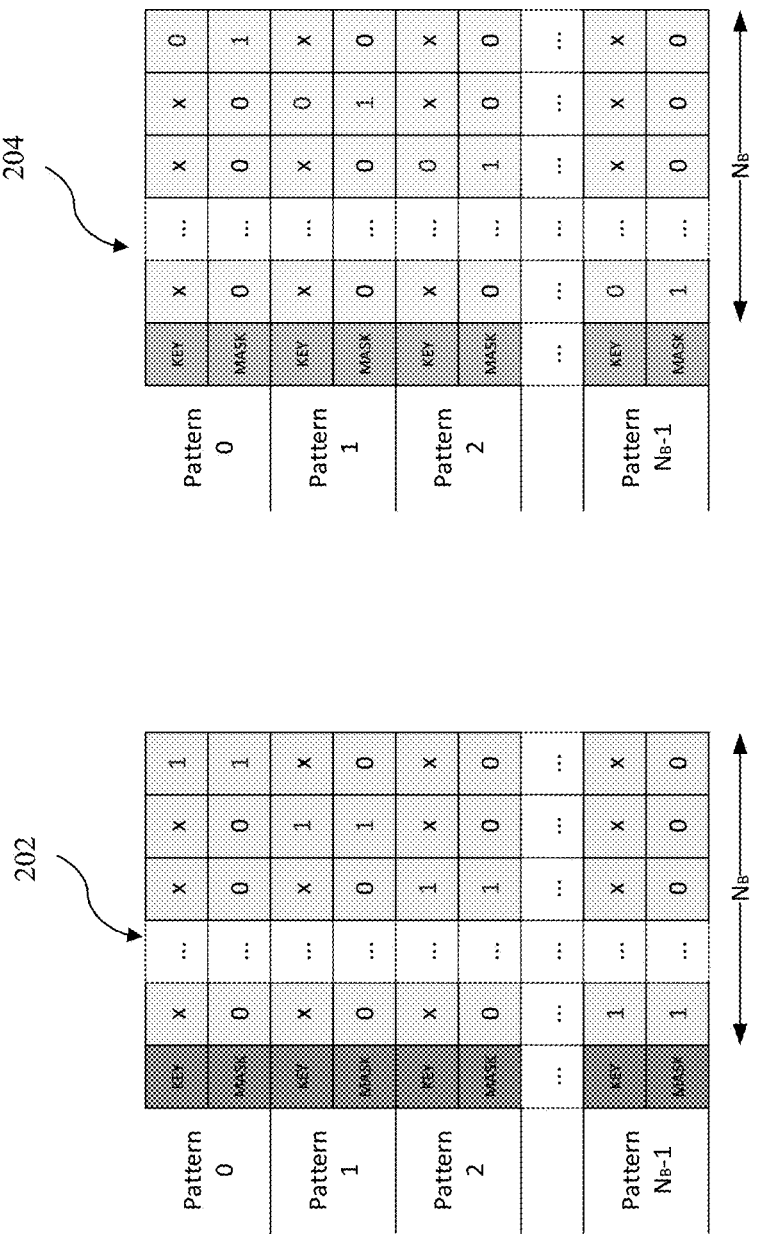
FIG. 2 illustrates example Keys-Mask pairs for the fault detection patterns of FIG. 1, according to some embodiments.

In embodiments, fault detection patterns 104a and 104b may be translated into the example Keys-Mask pairs as illustrated in FIG. 2, in accordance with an example TCAM model. (Note that the Keys-Mask pairs may differ for different TCAM models.) When performing Lookup operation with Pattern number i from the "1 Value Patterns" group 104a, the hit output array (e.g., 312 of FIG. 3) will be set in all the Rules of TCAM which have 1 or don't care in their i's column. Equivalently, Lookup operation with Pattern i from the "0 Value Patterns" group 104b, will cause the hit output array to be set in all the Rules with 0 or don't care in their i's column.

Figure 3:
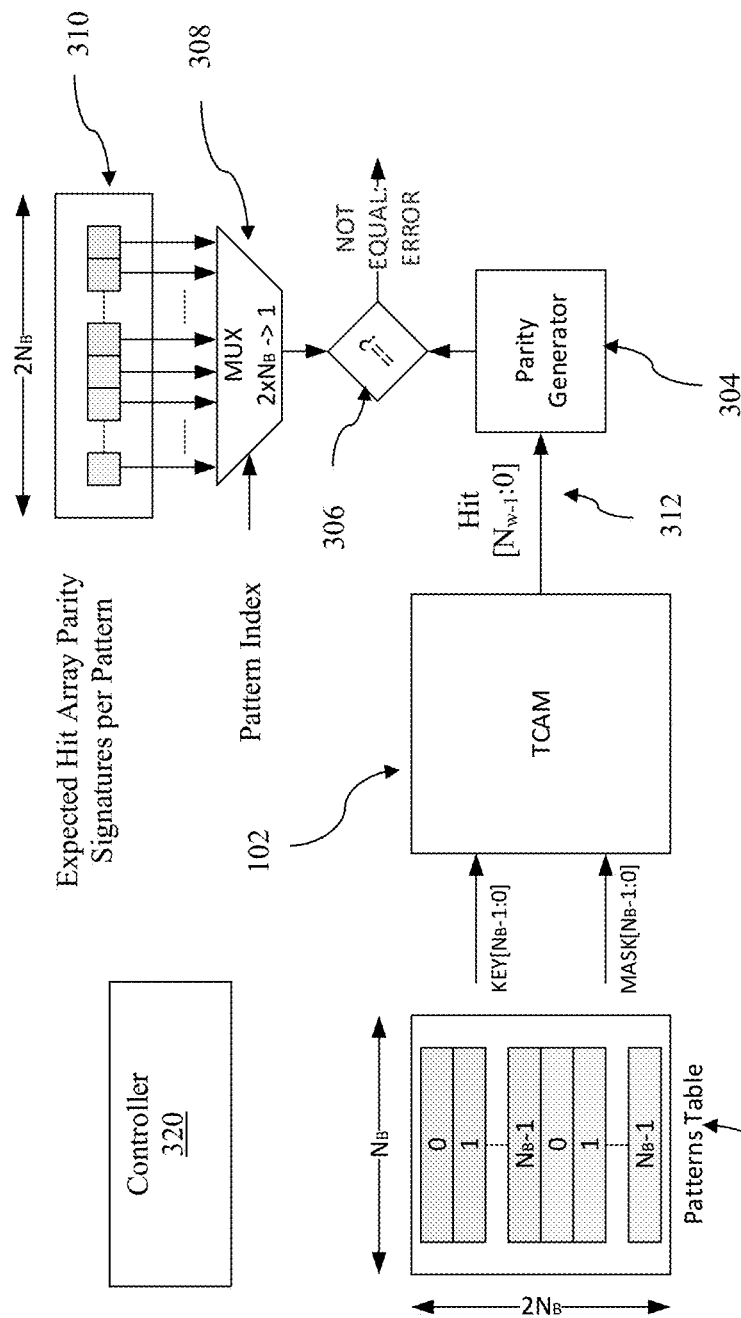
FIG. 3 illustrates an arrangement for checking of a TCAM for soft errors, according to some embodiments.

Referring now to FIG. 3, wherein an arrangement for checking a TCAM for soft errors, according to various embodiments, is illustrated. As shown, for the embodiments, the fault detection patterns (e.g., in Keys-Mask pairs) may be generated and stored in a table 302. Per predefined time, all of the fault detection patterns may be generated, outputted and used as keys to perform look up operations on TCAM 102, to generate hit output arrays 312. In other embodiments, the generation may be performed on-the-fly when the look up operations on TCAM 102 are performed, e.g., at every checking phase.

The resulted hit output array 312 of each pattern may then be inputted to parity generator 304 to have its Parity signature generated. Parity generator 304 may generate the Parity signature in any one of a number of known techniques. For example, Interleaving Parity may be used to spare time required to generate the parity of all the arrays and make it better protected from cases when there are soft error in two (or any other even number) of soft errors in the same column. Odd and even rules in hit output array may get their parity bits generated in parallel to each other. On generation, the Parity signature of a hit output array 312 may be compared against the expected parity value to determine if the two values match, using comparator 306. In embodiments, a True comparison result denotes successful comparison, whereas a False comparison result denotes detection of a soft error.

In embodiments, the expected parity values of the hit output arrays may be stored in a separated array 310, and selected for comparison using multiplexor 308. (Note that under the present disclosure, the parity is generated on the hit output array, and not on the TCAM content.)

In embodiments, a controller 320 may be provided (e.g., as part of the TCAM arrangement) to direct/control the TCAM soft error detection operations described. Controller 320, parity generator 304 and comparator 306, may be collectively referred to as the logic and/or circuitry for detecting soft error of a TCAM. In embodiments, controller 320, parity generator 304 and comparator 306 may be implemented in any hardware and/or software combination. Hardware may include ASIC or programmable circuits, and software may include instructions in any one of a number of programming languages. Table 302 and array 310 may be stored in any volatile or non-volatile storage, dedicated or temporally allocated storage known in the art.

Accordingly, soft errors of a TCAM may be more efficiently detected, with the detection time only proportional to the width of the array (independent of the height of the array), which remains substantially constant.

After reset and prior to first configuration, controller 320 may cause all of the $2 \times N_W$ lines (both Entry0 and Entry1 of all the $N_W$ rules) of the TCAM array be written with 0s. Controller 320 may further cause the expected Hit Array Parity Signature be set to 0 as well ($N_W$ is expected to be even). This may be done only once, after reset of the device with the TCAM.

Afterwards, every rule update may require reading the previous rule, intended to be modified—Read-Modify-Write. In other words, every rule update may require 2 reads (Entry 0 and Entry 1). Then, the previous rule may be compared to a new written rule and the Expected Hit Array Parity Signature may then be changed according to the Truth Table in FIG. 4 and the example scheme in FIGS. 5 and 6, described more fully below.

In embodiments, some of the preceding described operations may be performed prior to TCAM rule update. This is, however, not expected to a big overhead, since the rule update is not performed on a very frequent basis. In embodiments, this overhead may be spared if a driver of the operating system of a host device of the TCAM holds a shadow of TCAM rules. For these embodiments, the driver may be configured to write the calculated parity bit directly, as it knows the old and the modified entries. The TCAM encoding may then be done according to a specific encoding of TCAM, and can be changed easily to any other encoding.

In various embodiments, the TCAM may be encoded in accordance with the example Truth Table 400 illustrated in FIG. 4. For example, for the "Global don't care" situation, with Entry0 and Entry1 set to "X," and the Key-Mask pair equals (X, 0), the hit output for "Global don't care" will be "1." For the "invalid" situation, with Entry0 and Entry1 set to "0," and the Key-Mask pair equals (X, 1), the hit output for "invalid" will be "0," and so on. In general, for the embodiments, the following formula may be used to represent the Hit rules of TCAM:

$$\text{Hit}[i]=((\sim\text{tcam}[i,0]\&\sim\text{Key}\&\text{Mask}==0)\&((\sim\text{tcam}[i,1]\&\text{Key}\&\text{Mask})==0)$$

where tcam[i, 0] and tcam[i, 1] are the Entry0 and Entry1 entries that comprise rule i.

Figure 5:
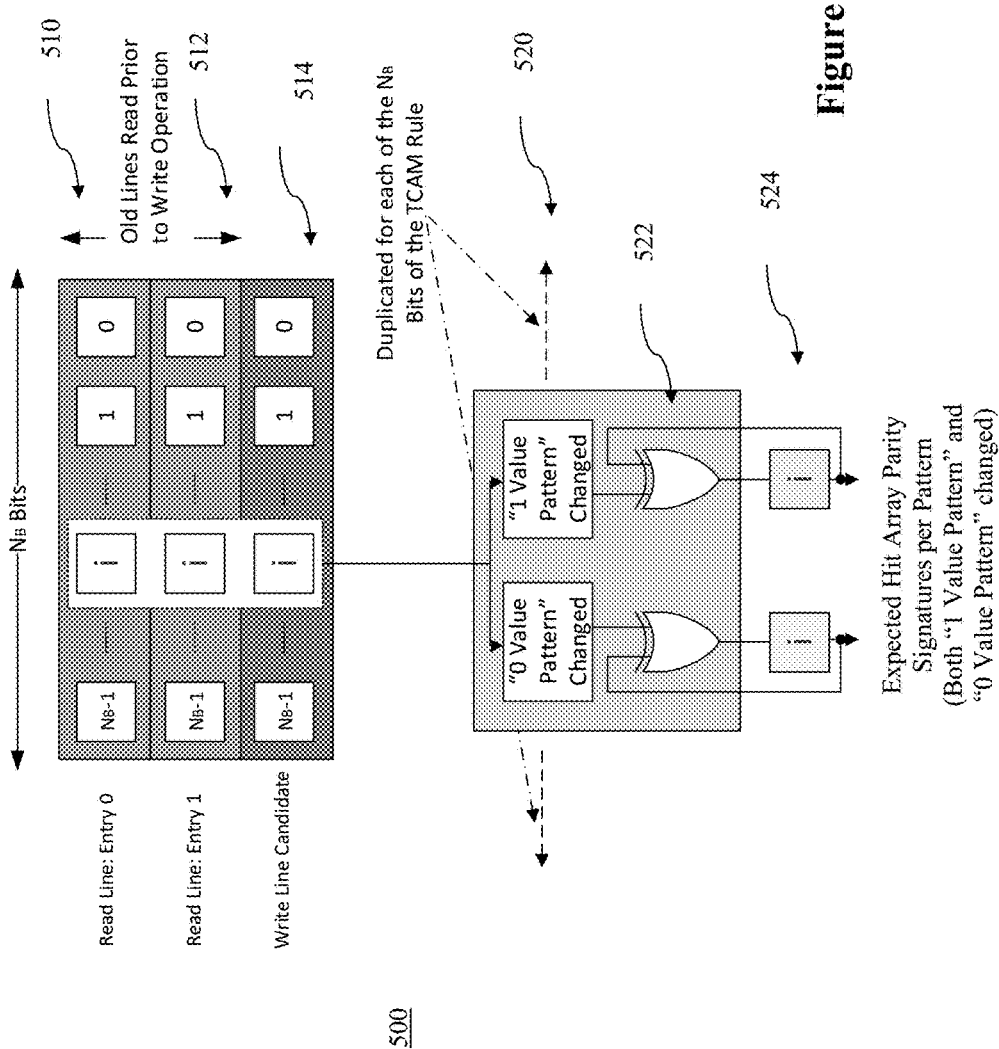
FIG. 5 illustrates an example mechanism for updating the expected parity results when a TCAM rule is updated, according to some embodiments.

FIG. 5 illustrates an example mechanism of updating the Expected Hit Array Parity Signature due to the Rule Update, according to various embodiments. The process may require a read of the previous rule, both the Entry0 and Entry1 (510, 512). Then, depending on the Write Line Candidate (514), a check may be performed to determine whether the Expected Hit Array Parity Signature should be changed from its previous value. It may be done per bit in the Line, both for "0 Pattern" and "1 Pattern": Per bit in line may include two blocks "0 Value Pattern" changed and "1 Value Pattern" changed 520. During the write, an XOR operation (522) may be performed with previous Expected Hit Array Parity Signatures per pattern and the result of the blocks, to get the new Expected Hit Array Parity Signatures per pattern (524).

FIG. 6 illustrates an example Truth Table of the "0 Value Pattern" changed and "1 Value Pattern" changed, according to various embodiments. In Table 600 of FIG. 6, a "[0]" or "[1]" entry refers to the case where the Entry0 is written to the TCAM, while a "{0} or {1}" entry refers to case where the Entry1 is written to the TCAM. For example, for row 602, when Read Line Entry0 (E0) and Read Line Entry1 (E1) both have the value "0," and Write Line Entry0 (E0) has the value 1, then "1 Value Pattern" changed and "0 Value Pattern" changed have values equal to [0] and [1]. On the other hand, for row 602, when Read Line Entry0 (E0) and Read Line Entry1 (E1) both have the value "0," and Write Line Entry1 (E1) has the value 1, then "1 Value Pattern" changed and "0 Value Pattern" changed have values equal to {1} and {0}.

Figure 9:
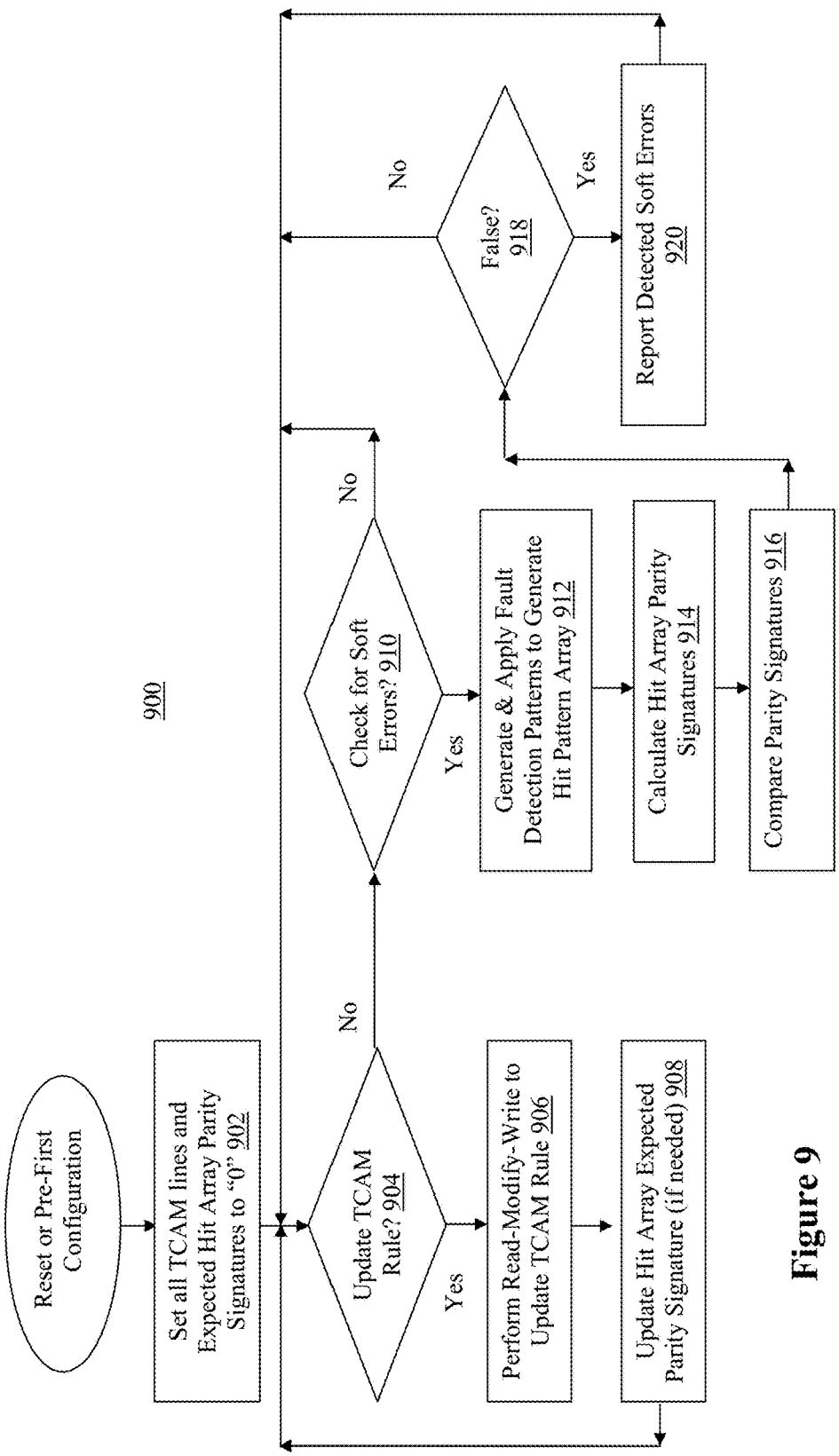
FIG. 9 illustrates an example process for detecting TCAM soft errors, in accordance with various embodiments.

Referring now to FIG. 9, wherein a flow diagram summarizing an example process for detecting TCAM soft errors, according to various embodiments, is shown. As illustrated, process 900 for detecting TCAM soft errors may include operations performed at blocks 902-920. The operations may be performed e.g., by the earlier described controller 320. In alternate embodiments, some of the operations can be split, combined, or performed in different orders.

Process 900 may begin at block 902. At block 902, on reset or before the first configuration, all TCAM lines and expected parity signatures of the hit output array may be set to "0." Next, a determination may be on whether any of the TCAM rules are to be updated. If a result on the determination is affirmative, process 900 may continue at block 906. At block 906, a read-modify-write may be performed to update a TCAM rule. Next, at 908, the expected parity signature of the hit output array corresponding to the TCAM rule being updated may be updated. The operations at block 904-908 may initially be repeated a number of times to configure the TCAM with all the rules.

Eventually, a result of the determination at block 904 may be negative. At that point, process 900 may continue at block 910. At block 910, a determination may be made on whether it is time to check the TCAM for soft errors. If a result on the determination is negative, process 900 may return to block 904 and continue therefrom as earlier described.

If a result on the determination at block 910 is affirmative, process 900 may proceed to block 912. At block 912, fault detection patterns may be generated, stored, and caused to be applied to the TCAM, to generate the hit output array. Next, at block 914, parity signatures of the hit output array may be calculated. At block 916, the calculate parity signatures of the hit output array, and the expected parity signatures of the hit output array may be compared.

At block 918, a determination may be made on whether there are any false comparisons. If a result of the determination indicates there are one or more false comparisons, at block 920, detection of soft error or errors may be reported. If a result of the determination indicates there is no false comparison, process 900 may return to block 904, and continue therefrom as earlier described.

Process 900 may be iterated as many times as necessary during operation, until the host device of the TCAM is powered off or enters a sleep state.

Figure 7:
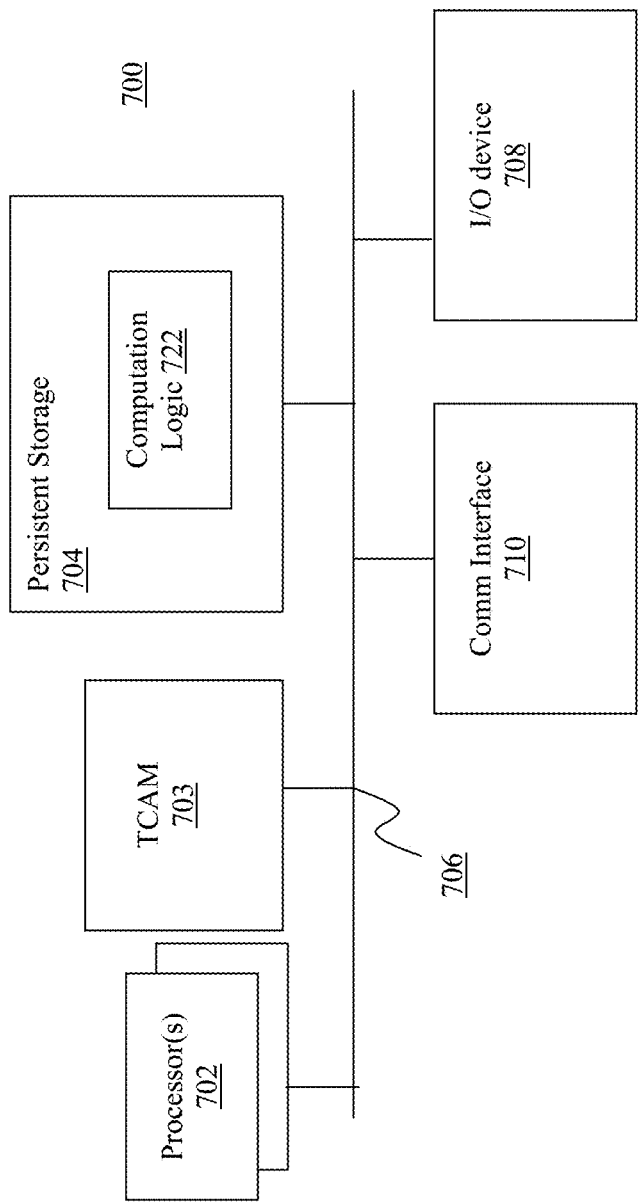
FIG. 7 illustrates a block diagram of an example architecture of a computing device suitable for use to practice the present disclosure, in accordance with various embodiments.

Referring now to FIG. 7, wherein a block diagram of an example architecture of a computing device suitable for use to host a TCAM of the present disclosure, in accordance with various embodiments, is illustrated. As shown, computing device 700 may include one or more processors 702, TCAM 703, and persistent memory 704. In embodiments, each processor may include multiple processor cores, and/or programmable circuits (such as FPGA), which may all be disposed on one die. TCAM 703 may be TCAM 102 having associated logic/circuitry for detecting soft errors, described earlier with references to FIGS. 2-6. In alternate embodiments, TCAM 703 may be part of processor 702. Additionally, computing device 700 may include communication interfaces 710, such as, Ethernet, WiFi, Bluetooth, 3G/4G and so forth, and I/O device 708 may include cameras, display devices, keyboard, cursor control and so forth. The elements may be coupled to each other via system bus 706, which may represent one or more buses. In the case of multiple buses, they may be bridged by one or more bus bridges (not shown).

Except for the TCAM and methods/circuitry associated with detecting soft errors of the TCAM, each of these elements may perform its conventional functions known in the art. Persistent memory 704 may be employed to store a copy of computing logic 722 implementing one or more applications, an operating system, and/or aspects of the TCAM soft error detection operations described earlier (e.g., the earlier described operating system driver associated with TCAM soft error detection). Computing logic 722 may be implemented in assembler instructions supported by processor(s) 702 or high-level languages, such as, for example, C or a scripting language, which can be compiled into such instructions. The programming instructions may be placed into persistent memory 704 in the factory, or in the field, through, for example, a distribution medium (not shown), such as a compact disc (CD), or through communication interface 710 (from a distribution server (not shown)). The number, capability and/or capacity of these elements 702-710 may vary from embodiments to embodiments and/or depending on whether computing device 700 is used as a wearable device, a mobile device (smartphone, tablet, laptop, and so forth), a desktop device (desktop computer, set-top box, game console, and so forth) or a server (stand-alone or part of a rack). The constitutions of these elements 702-710 are otherwise known, and accordingly will not be further described.

Figure 8:
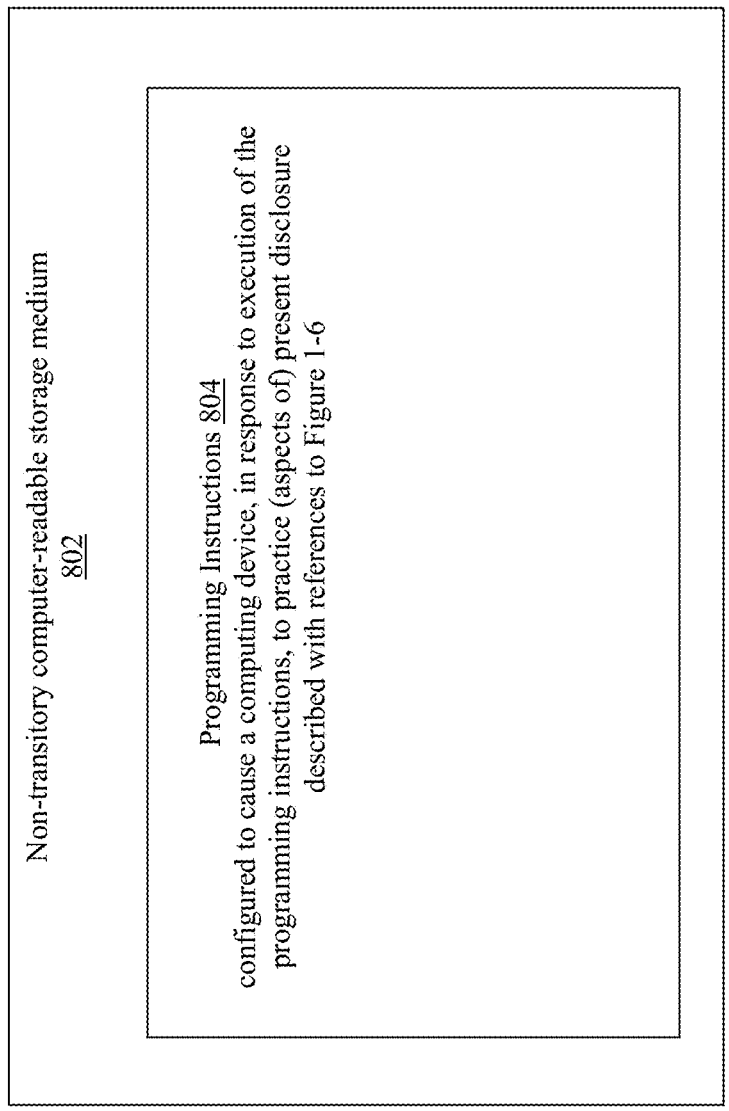
FIG. 8 illustrates an example computer-readable storage medium with instructions configured to enable a computing device to practice aspects of the present disclosure, in accordance with various embodiments.

FIG. 8 illustrates an example non-transitory computer-readable storage medium having instructions configured to practice all or selected ones of the operations associated with TCAM soft error detection, earlier described, in accordance with various embodiments. As illustrated, non-transitory computer-readable storage medium 802 may include a number of programming instructions 804. Programming instructions 804 may be configured to enable a device, e.g., computing system 700, in response to execution of the programming instructions, to perform various operations earlier described. In alternate embodiments, programming instructions 804 may be disposed on multiple non-transitory computer-readable storage media 802 instead. In still other embodiments, programming instructions 804 may be encoded in transitory computer readable signals. The programming instruction may also include piece of software that protects or encrypts the data in the memory, storage, data being processed, and in communication channel being exposed to the hackers.

Referring back to FIG. 7, for one embodiment, at least one of processors 702 with TCAM 703 may be packaged together with a computer-readable storage medium having aspects of computing logic 722 (in lieu of storing in system memory 704) configured to practice all or selected aspects of TCAM soft error detection. For one embodiment, at least one of processors 702 with TCAM 703 may be packaged together with a computer-readable storage medium having aspects of computing logic 722 to form a System in Package (SiP). For one embodiment, at least one of processors 702 with TCAM 703 may be integrated on the same die with a computer-readable storage medium having aspects of computing logic 722. For one embodiment, at least one of processors 702 with TCAM 703 may be packaged together with a computer-readable storage medium having aspects of computing logic 722 to form a System on Chip (SoC).

Thus, example embodiments described may include:

Example 1 may be an apparatus for computing, comprising: a Ternary-Content-Addressable-Memory (TCAM); and logic or circuitry coupled to the TCAM to detect soft errors of the TCAM; wherein to detect the soft errors, the logic or circuitry is to: apply a plurality of fault detection patterns to the TCAM to generate a hit output array for the plurality of fault detection patterns, generate respective parity signatures for entries of the hit output array, and compare the generated parity signatures to corresponding expected parity signatures of the entries of the hit output array.

Example 2 may be example 1, wherein the TCAM may comprise a $2 \times N_W$—entry array for $N_W$—rules, with each entry in the TCAM array being $N_B$ bits wide, and the plurality of fault detection patterns may comprise two sets of $N_B \times N_B$ patterns.

Example 3 may be example 2, wherein the two sets of $N_B \times N_B$ patterns may comprise a set of 1 Value Patterns, and a set of 0 Value Patterns.

Example 4 may be example 1, wherein each fault detection pattern may comprise a Key-Mask pair.

Example 5 may be example 1, wherein the logic or circuitry may comprise a storage coupled to the TCAM to store the plurality of fault detection patterns, and output the plurality of fault detection patterns to apply to the TCAM.

Example 6 may be example 1, wherein the logic or circuitry may generate the plurality of fault detection patterns in real time, when the plurality of fault detection patterns are needed for application to the TCAM.

Example 7 may be example 1, wherein the logic or circuitry may comprise a parity signature generator coupled to the TCAM to generate the parity signatures for the hit output array.

Example 8 may be example 7, the logic or circuitry may comprise a storage to store the expected parity signatures, and a multiplexor coupled to the storage to selectively output the expected parity signatures of the hit output array.

Example 9 may be example 8, wherein the logic or circuitry may further comprise a comparator coupled to parity signature generator and the multiplexor to compare the generated parity signatures with the expected parity signatures of the hit output array.

Example 10 may be example 9, wherein the logic or circuitry may detect a soft error on false comparison of the generated parity signature with the expected parity signature of one of the entries of the hit output array.

Example 11 may be example 10, wherein the logic or circuitry may comprise a controller coupled to parity signature generator, the multiplexor, and the comparator to control their operations.

Example 12 may be example 1, wherein the TCAM may comprise $2 \times N_W$ lines for $N_W$ rules, and the logic or circuitry is to cause all lines of the TCAM and the expected parity signatures of the hit output array to be written with or set to 0s, on reset or prior to a first configuration of the TCAM.

Example 13 may be example 12, wherein the logic or circuitry is to perform a Read-Modify-Write operation to update one of the $N_W$ rules.

Example 14 may be example 13, wherein the logic or circuitry is to further perform a check on whether one of the expected parity signatures corresponding to the rule being updated, is to be updated.

Example 15 may be any one of examples 1-14, wherein a hit output array value for rule i is $$\text{Hit}[i] = ((\sim\text{tcam}[i,0] \& \sim\text{Key} \& \text{Mask} == 0) \& ((\sim\text{tcam}[i,1] \& \text{Key} \& \text{Mask}) == 0)$$

where tcam[i, 0] and tcam[i, 1] are the Entry0 and Entry1 entries that comprise rule I, and Key and Mask may be parts of a fault detection pattern.

Example 16 may be a method for computing, comprising: applying a plurality of fault detection patterns to a Ternary-Content-Addressable-Memory (TCAM) to generate a hit output array for the plurality of fault detection patterns; generating respective parity signatures for entries of the hit output array; and comparing the generated parity signatures to expected parity signatures of the entries of the hit output array.

Example 17 may be example 16, wherein the TCAM may comprise a $2 \times N_W$—entry array for $N_W$—rules, with each entry in the TCAM array being $N_B$ bits wide, and the plurality of fault detection patterns may comprise two sets of $N_B \times N_B$ patterns; wherein the two sets of $N_B \times N_B$ patterns may comprise a set of 1 Value Patterns, and a set of 0 Value Patterns; and wherein each fault detection pattern may comprise a Key-Mask pair.

Example 18 may be example 16, further comprising storing the plurality of fault detection patterns in a storage, and outputting the plurality of fault detection patterns to apply to the TCAM.

Example 19 may be example 16, further comprising generating the plurality of fault detection patterns in real time, when the plurality of fault detection patterns are needed for application to the TCAM.

Example 20 may be example 16, further comprising generating the parity signatures for the entries of the hit output array.

Example 21 may be example 20, further comprising storing the expected parity signatures in a storage, and selectively outputting the expected parity signatures of the entries of the hit output array.

Example 22 may be example 21, may further comprise comparing the generated parity signatures with the expected parity signatures of the entries of the hit output array; and detecting a soft error on false comparison of the generated parity signature with the expected parity signature of one of the entries of the hit output array.

Example 23 may be example 16, wherein the TCAM may comprise $2 \times N_W$ lines for $N_W$ rules, and the method may further comprise causing all lines of the TCAM and the expected parity signatures of the entries of the hit output array to be written with or set to 0s, on reset or prior to a first configuration of the TCAM.

Example 24 may be example 23, further comprising performing a Read-Modify-Write operation to update one of the $N_W$ rules.

Example 25 may be example 24, further comprising performing a check on whether one of the expected parity signatures corresponding to the rule being updated, is to be updated.

Example 26 may be any one of examples 16-25, wherein generating the hit output array may comprise generating a hit output array value for rule i in accordance with:

$$\text{Hit}[i]=((\sim\text{tcam}[i,0]\&\sim\text{Key}\&\text{Mask}==0)\&((\sim\text{tcam}[i,1]\&\text{Key}\&\text{Mask})==0)$$

where tcam[i, 0] and tcam[i, 1] are the Entry0 and Entry1 entries that comprise rule I, and Key and Mask are parts or a fault detection pattern.

Example 27 may be at least one computer readable media (CRM) comprising a plurality of instructions configured to cause a Ternary-Content-Addressable-Memory (TCAM) arrangement, in response to execution of the instructions, to: generate parity signatures for entries of a hit output array of the TCAM, wherein the hit output array is outputted in response to application of a plurality of fault detection patterns to the TCAM; and compare the generated parity signatures to corresponding expected parity signatures of the entries of the hit output array.

Example 28 may be example 27, wherein the TCAM may comprise a $2\times N_W$—entry array for $N_W$—rules, with each entry in the TCAM array being $N_B$ bits wide, and the plurality of fault detection patterns may comprise two sets of $N_B\times N_B$ patterns; wherein the two sets of $N_B\times N_B$ patterns may comprise a set of 1 Value Patterns, and a set of 0 Value Patterns; and wherein each fault detection pattern may comprise a Key-Mask pair.

Example 29 may be example 27, wherein the TCAM arrangement may further caused to store the plurality of fault detection patterns in a storage, and output the plurality of fault detection patterns to apply to the TCAM.

Example 30 may be example 27, wherein the TCAM arrangement may further caused to generate the plurality of fault detection patterns in real time, when the plurality of fault detection patterns are needed for application to the TCAM.

Example 31 may be example 27, wherein the TCAM arrangement may further caused to generate the parity signatures for the hit output arrays.

Example 32 may be example 31, wherein the TCAM arrangement may further caused to store the expected parity signatures in a storage, and selectively output the expected parity signatures.

Example 33 may be example 32, wherein the TCAM arrangement may further caused to compare the generated parity signatures with the expected parity signatures of the entries of the hit output array; and detect a soft error on false comparison of the generated parity signature with the expected parity signature of one of the entries of the hit output array.

Example 34 may be any one of examples 27, and 29-33, wherein the TCAM may comprise $2\times N_W$ lines for $N_W$ rules, and wherein the TCAM arrangement is further caused to write into or set all lines of the TCAM and the expected parity signatures of the entries of the hit output array to 0s, on reset or prior to a first configuration of the TCAM.

Example 35 may be example 34, wherein the TCAM arrangement may further caused to perform a Read-Modify-Write operation to update one of the $N_W$ rules.

Example 36 may be example 35, wherein the TCAM arrangement may further caused to perform a check on whether one of the expected parity signatures corresponding to the rule being updated, is to be updated.

Example 37 may be an apparatus for computing, comprising: a Ternary-Content-Addressable-Memory (TCAM); means for applying a plurality of fault detection patterns to the TCAM to generate a hit output array for the plurality of fault detection patterns; means for generating parity signatures for entries of the hit output array; and means for comparing the generated parity signatures to corresponding expected parity signatures of the entries of the hit output array.

Example 38 may be example 37, wherein the TCAM may comprise a $2\times N_W$—entry array for $N_W$—rules, with each entry in the TCAM array being $N_B$ bits wide, and the plurality of fault detection patterns may comprise two sets of $N_B\times N_B$ patterns; wherein the two sets of $N_B\times N_B$ patterns may comprise a set of 1 Value Patterns, and a set of 0 Value Patterns; and wherein each fault detection pattern may comprise a Key-Mask pair.

Example 39 may be example 37, wherein means for applying may comprise means for storing the plurality of fault detection patterns in a storage, and means for outputting the plurality of fault detection patterns to apply to the TCAM.

Example 40 may be example 37, further comprising means for generating the plurality of fault detection patterns in real time, when the plurality of fault detection patterns are needed for application to the TCAM.

Example 41 may be example 37, further comprising means for generating the parity signatures for entries of the hit output array.

Example 42 may be example 41, further comprising means for storing the expected parity signatures in a storage, and selectively outputting the expected parity signatures.

Example 43 may be example 37, wherein the TCAM may comprise $2\times N_W$ lines for $N_W$ rules, and the apparatus may further comprise means for writing or setting all lines of the TCAM and the expected parity signatures of the entries of the hit output array to 0s, on reset or prior to a first configuration of the TCAM.

Example 44 may be example 43, further comprising means for performing a Read-Modify-Write operation to update one of the $N_W$ rules.

Example 45 may be example 44, further comprising means for performing a check on whether one of the expected parity signatures corresponding to the rule being updated, is to be updated.

Example 46 may be any one of examples 27-45, wherein means for generating the hit output array may comprise means for generating a hit output array value for rule i in accordance with:

$$\text{Hit}[i]=((\sim\text{tcam}[i,0]\&\sim\text{Key}\&\text{Mask}==0)\&((\sim\text{tcam}[i,1]\&\text{Key}\&\text{Mask})==0)$$

where tcam[i, 0] and tcam[i, 1] are the Entry0 and Entry1 entries that comprise rule I, and Key and Mask are parts of a tault detection pattern.

Example 47 may be one of examples 15, 26 or 46, wherein the TCAM may comprise cells emulated with static random access memory (SRAM) cells.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. An apparatus for computing, comprising:
a Ternary-Content-Addressable-Memory (TCAM); and
logic or circuitry coupled to the TCAM to detect soft errors of the TCAM;
wherein to detect the soft errors, the logic or circuitry is to: apply a plurality of fault detection patterns to the TCAM to generate a hit output array for the plurality of fault detection patterns, generate respective parity signatures for entries of the hit output array, and compare the generated parity signatures to corresponding expected parity signatures of the entries of the hit output array;
wherein the TCAM comprises a $2 \times N_w$—entry array for $N_w$—rules, with each entry in the TCAM array being $N_B$ bits wide, and the plurality of fault detection patterns comprise two sets of $N_B \times N_B$ patterns.

2. The apparatus of claim 1, wherein the two sets of $N_B \times N_B$ patterns comprise a set of 1 Value Patterns, and a set of 0 Value Patterns.

3. The apparatus of claim 1, wherein each fault detection pattern comprises a Key-Mask pair.

4. The apparatus of claim 1, wherein the logic or circuitry comprises a storage coupled to the TCAM to store the plurality of fault detection patterns, and output the plurality of fault detection patterns to apply to the TCAM.

5. The apparatus of claim 1, wherein the logic or circuitry is to generate the plurality of fault detection patterns in real time, when the plurality of fault detection patterns are needed for application to the TCAM.

6. An apparatus for computing, comprising:
a Ternary-Content-Addressable-Memory (TCAM); and
logic or circuitry coupled to the TCAM to detect soft errors of the TCAM; wherein to detect the soft errors, the logic or circuitry is to: apply a plurality of fault detection patterns to the TCAM to generate a hit output array for the plurality of fault detection patterns, generate respective parity signatures for entries of the hit output array, and compare the generated parity signatures to corresponding expected parity signatures of the entries of the hit output array;
wherein the logic or circuitry comprises a parity signature generator coupled to the TCAM to generate the parity signatures for the hit output array.

7. The apparatus of claim 6, wherein the logic or circuitry comprises a storage to store the expected parity signatures, and a multiplexor coupled to the storage to selectively output the expected parity signatures of the hit output array.

8. The apparatus of claim 7, wherein the logic or circuitry further comprises a comparator coupled to the parity signature generator and the multiplexor to compare the generated parity signatures with the expected parity signatures of the hit output array.

9. The apparatus of claim 8, wherein the logic or circuitry is to detect a soft error on false comparison of the generated parity signature with the expected parity signature of one of the entries of the hit output array.

10. The apparatus of claim 9, wherein the logic or circuitry comprises a controller coupled to parity signature generator, the multiplexor, and the comparator to control their operations.

11. The apparatus of claim 6, wherein the TCAM comprises $2 \times N_w$ lines for $N_w$ rules, and the logic or circuitry is to cause all lines of the TCAM and the expected parity signatures of the hit output array to be written with or set to 0s, on reset or prior to a first configuration of the TCAM.

12. The apparatus of claim 11, wherein the logic or circuitry is to perform a Read-Modify-Write operation to update one of the $N_w$ rules.

13. The apparatus of claim 12, wherein the logic or circuitry is to further perform a check on whether one of the expected parity signatures corresponding to the rule being updated is to be updated.

14. The apparatus of claim 6, wherein a hit output array value for rule i is $$\text{Hit}[i] = ((\sim\text{tcam}[i,0] \& \sim\text{Key}\&\text{Mask}==0) \& ((\sim\text{tcam}[i,1] \& \text{Key}\&\text{Mask})==0)$$

where tcam[i, 0] and tcam[i, 1] are Entry0 and Entry1 entries that comprise rule I, and Key and Mask are parts of a fault detection pattern.

15. A method for computing, comprising:
applying a plurality of fault detection patterns to a Ternary-Content-Addressable-Memory (TCAM) to generate a hit output array for the plurality of fault detection patterns;
generating respective parity signatures for entries of the hit output array; and
comparing the generated parity signatures to expected parity signatures of the entries of the hit output array;
wherein to generate the hit output array comprises generating a hit output array value for rule i in accordance with $$\text{Hit}[i] = ((\sim\text{tcam}[i,0] \& \sim\text{Key}\&\text{Mask}==0) \& ((\sim\text{tcam}[i,1] \& \text{Key}\&\text{Mask})==0)$$

where tcam[i, 0] and tcam[i, 1] are Entry0 and Entry1 entries that comprise rule I, and Key and Mask are parts of a fault detection pattern.

16. The method of claim 15, further comprising generating the plurality of fault detection patterns in real time, when the plurality of fault detection patterns are needed for application to the TCAM.

17. The method of claim 15, further comprising generating the parity signatures for the entries of the hit output array; storing the expected parity signatures in a storage, and selectively outputting the expected parity signatures of the entries of the hit output array; and comparing the generated parity signatures with the expected parity signatures of the entries of the hit output array; and detecting a soft error on false comparison of the generated parity signature with the expected parity signature of one of the entries of the hit output array.

18. The method of claim 15, wherein the TCAM comprises $2 \times N_w$ lines for $N_w$ rules, and the method further comprises causing all lines of the TCAM and the expected parity signatures of the entries of the hit output array to be written with or set to 0s, on reset or prior to a first configuration of the TCAM; performing a Read-Modify-Write operation to update one of the $N_w$ rules; and performing a check on whether one of the expected parity signatures corresponding to the rule being updated is to be updated.

19. At least one computer readable media (CRM) comprising a plurality of instructions configured to cause a Ternary-Content-Addressable-Memory (TCAM) arrangement, in response to execution of the instructions, to:

generate parity signatures for entries of a hit output array of the TCAM, wherein the hit output array is outputted in response to application of a plurality of fault detection patterns to the TCAM; and compare the generated parity signatures to corresponding expected parity signatures of the entries of the hit output array;

wherein the TCAM arrangement is further caused to generate the parity signatures for the hit output arrays, store the expected parity signatures in a storage, and selectively output the expected parity signatures, and compare the generated parity signatures with the expected parity signatures of the entries of the hit output array; and detect a soft error on false comparison of the generated parity signature with the expected parity signature of one of the entries of the hit output array.

20. The at least one CRM of claim 19, wherein the TCAM arrangement is further caused to store the plurality of fault detection patterns in a storage, and output the plurality of fault detection patterns to apply to the TCAM, and generate the plurality of fault detection patterns in real time, when the plurality of fault detection patterns are needed for application to the TCAM.

21. The at least one CRM of claim 19, wherein the TCAM comprises $2 \times N_w$ lines for $N_w$ rules, and wherein the TCAM arrangement is further caused to write into or set all lines of the TCAM and the expected parity signatures of the entries of the hit output array to 0s, on reset or prior to a first configuration of the TCAM.

22. The at least one CRM of claim 21, wherein the TCAM arrangement is further caused to perform a Read-Modify-Write operation to update one of the $N_w$ rules; and perform a check on whether one of the expected parity signatures corresponding to the rule being updated is to be updated.

* * * * *